United States Patent
Kelly et al.

(10) Patent No.: US 11,751,354 B1
(45) Date of Patent: Sep. 5, 2023

(54) ANTI-SAG MODULAR SERVER CHASSIS ASSEMBLY

(71) Applicant: Amazon Technologies, Inc., Seattle, WA (US)

(72) Inventors: Noah Thomas Kelly, Kingston, WA (US); Ryan F. Conroy, Seattle, WA (US); Christopher Mario Gil, Tacoma, WA (US); Ali Elashri, Seattle, WA (US); Munish Sharma, Bellevue, WA (US)

(73) Assignee: Amazon Technologies, Inc., Seattle, WA (US)

( * ) Notice: Subject to any disclaimer, the term of this patent is extended or adjusted under 35 U.S.C. 154(b) by 140 days.

(21) Appl. No.: 17/359,033

(22) Filed: Jun. 25, 2021

(51) Int. Cl.
*H05K 7/14* (2006.01)
*H05K 7/18* (2006.01)

(52) U.S. Cl.
CPC ......... *H05K 7/1489* (2013.01); *H05K 7/1487* (2013.01); *H05K 7/18* (2013.01)

(58) Field of Classification Search
None
See application file for complete search history.

(56) References Cited

U.S. PATENT DOCUMENTS

| | | | | |
|---|---|---|---|---|
| 2002/0105783 A1* | 8/2002 | Kitahara | ................ | G06F 1/203 361/679.48 |
| 2013/0301197 A1* | 11/2013 | Watanabe | ................ | H05K 5/03 361/679.01 |
| 2016/0295746 A1* | 10/2016 | Alvarado | ................ | G06F 1/181 |
| 2020/0029467 A1* | 1/2020 | Chang | ................ | G06F 1/203 |

* cited by examiner

*Primary Examiner* — James Wu
*Assistant Examiner* — Christopher L Augustin
(74) *Attorney, Agent, or Firm* — Kilpatrick Townsend & Stockton LLP

(57) ABSTRACT

A computing equipment box assembly can include a chassis base and a tray. The chassis base can include a bottom panel, an opening through the bottom panel, and a rim defined around the opening. The tray can include a body configured for supporting computing components, a frame section of the body sized to be supported atop the rim of the chassis base; and a downwardly embossed portion of the body extending downwardly from the rim and sized to fit within the opening of the chassis base when the frame section is supported atop the rim of the chassis base.

20 Claims, 5 Drawing Sheets

US 11,751,354 B1

ANTI-SAG MODULAR SERVER CHASSIS ASSEMBLY

BACKGROUND

Many datacenters utilize racks that can hold multiple server chassis or other chassis vertically above one another. Vertically adjacent chassis are often positioned with minimal clearance in between each other in an effort to maximize space usage. The small clearances are typically sufficient to allow a rack-mounted chassis to slide in and out of the rack without impinging or interfering with the next chassis down in the rack. However, some combinations of components that may be desirable to install in a chassis may result in a combined weight payload that may overload a conventional chassis. This may cause a chassis to sag and hamper the sliding of the next chassis down. Alternatively, the risk of such sagging may lead a designer to altogether avoid the otherwise desirable combination of components.

BRIEF DESCRIPTION OF THE DRAWINGS

Various embodiments in accordance with the present disclosure will be described with reference to the drawings, in which.

DETAILED DESCRIPTION

Techniques described herein can relate to modular assemblies that can mitigate sagging of a rack-mounted chassis. The assembly can include a chassis base with an opening extending through a bottom. The assembly can also include a reinforcing tray for bearing components to be carried inside a space defined by the chassis. The reinforcing tray can have an embossed portion. The embossed portion can make the tray stronger than if the tray was simply flat. The embossed portion can define a downwardly extending projection or bump that can fit into the opening of the chassis base. When the tray is assembled with the chassis base, a frame section extending around the projection on the tray can rest on or be supported by a rim defined around the opening in the chassis base. This may allow load from the tray (e.g., including load from the components borne by the tray) to be distributed into selected areas of the chassis base, such as into strengthened areas along upturned sides that may be present in the chassis base. The completed assembly may be better able to withstand sagging under the load of components in comparison to a chassis base of similar size without the embossed reinforcing tray.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
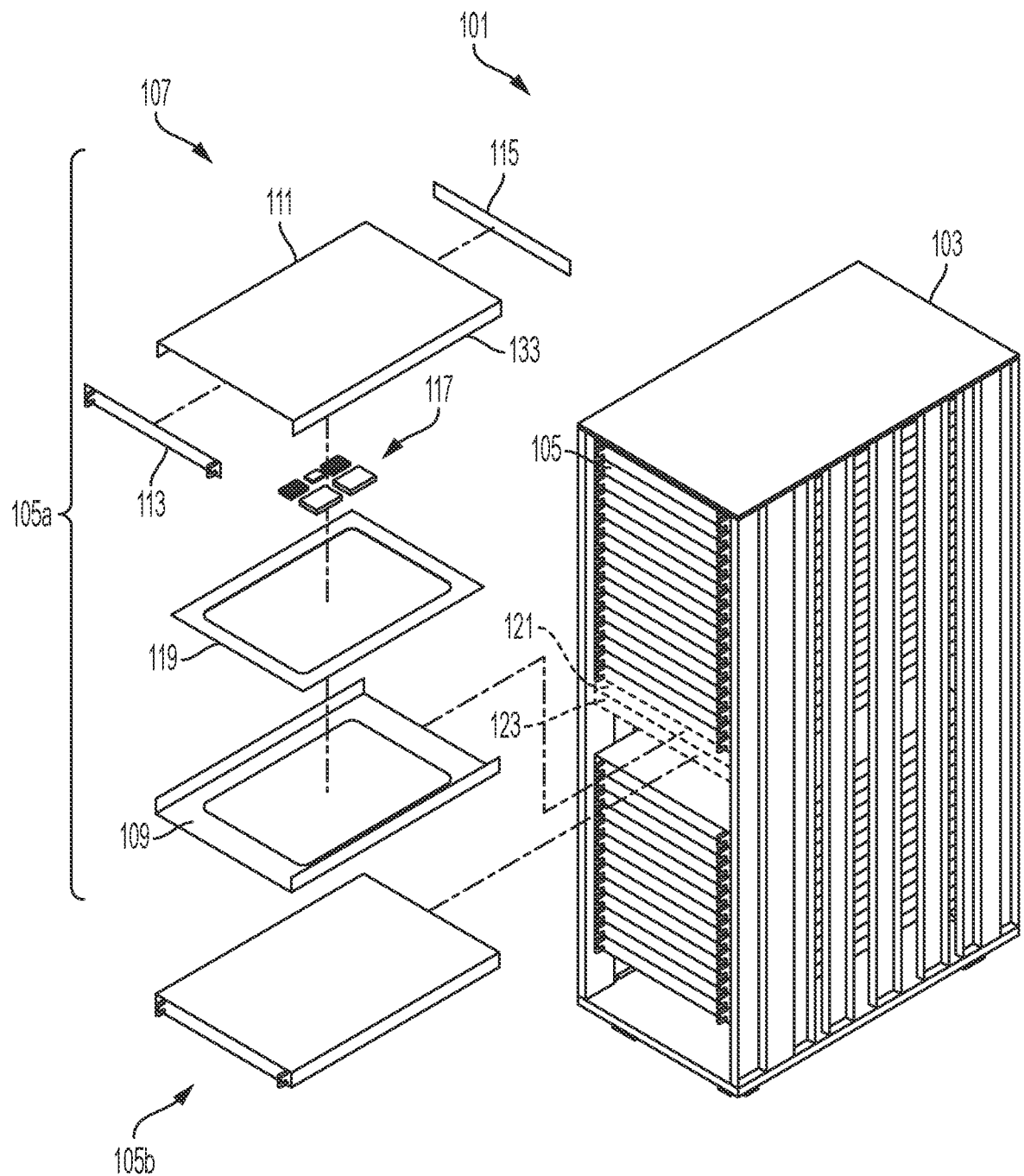
FIG. 1 illustrates a system with sag-resisting features according to certain embodiments.

FIG. 1 illustrates a system 101 according to certain embodiments. The system 101 may be utilized within a data center or other environment. The system 101 can include a rack 103, which may correspond to a server rack, for example. The rack 103 can include vertical members, horizontal members, and/or any other suitable structure for supporting rack-mounted units 105. The rack-mounted units 105 may be or include servers and thus will alternatively be referred to as servers 105 herein. However, the rack-mounted units 105 may additionally or alternatively be or include other structures, such as network switches or other units suitable for use in a datacenter, for example.

The servers 105 can be slidably received in the rack 103. In FIG. 1, the system 101 is depicted with two servers 105 outside the rack 103 for purposes of illustration. In FIG. 1, an upper server 105a is depicted in exploded view, while a lower server 105b is depicted in an assembled state for ease of viewing in comparison. The lower server 105b and/or other servers 105 of the rack 103 can be of like construction to that shown for the upper server 105a.

An individual server 105 can include or be coupled with an individual chassis 107. The chassis 107 can include elements of a server box, for example.

The chassis 107 may include a chassis base 109. The chassis base 109 may support other elements.

The chassis 107 may include a lid 111. The lid 111 may include or be coupled with a front panel 113 and/or a back panel 115. In some examples, the front panel 113 and/or the back panel 115 may be associated with or coupled with the chassis base 109. For example, the front panel 113 and/or the back panel 115 may be integrally formed with the chassis base 109 and/or the lid 111 or may be separate parts capable of coupling for assembly.

The chassis base 109 may receive the lid 111, e.g., to enclose components within the chassis 107. The chassis 107 may enclose computing components 117, for example. Suitable examples of individual components that may be enclosed within and/or supported by the chassis 107 include a printed circuit board, a fan, a solid state drive (SSD), a hard disk drive (HDD), a graphics processing unit (GPU), a heat sink, a cable, a connector, an interface, and/or other elements that may contribute to a weight payload of the chassis 107. Although listed individually, any of such components may be present singly or in multiples (or absent). In some examples, the combined weight payload of components enclosed within and/or supported by the chassis 107 may pose a risk of causing sagging or other deflection of the chassis base 109 absent other countermeasures.

The system 101 can further include a tray 119. The tray 119 can support the computing components 117 in use. The tray 119 can rest on or otherwise engage the chassis base 109. The tray 119 may reinforce the chassis base 109 relative to the load of the computing components 117. For example, when the upper server 105a is received in a first or upper volume 121 within the rack 103, the tray 119 may facilitate support of the computing components 117 and prevent sagging of the tray 119 into the lower volume 123 that receives the lower server 105b. The support by the tray 119 may be facilitated by features of the tray 119, e.g., as described with respect to FIG. 2 and other figures herein.

Figure 2:
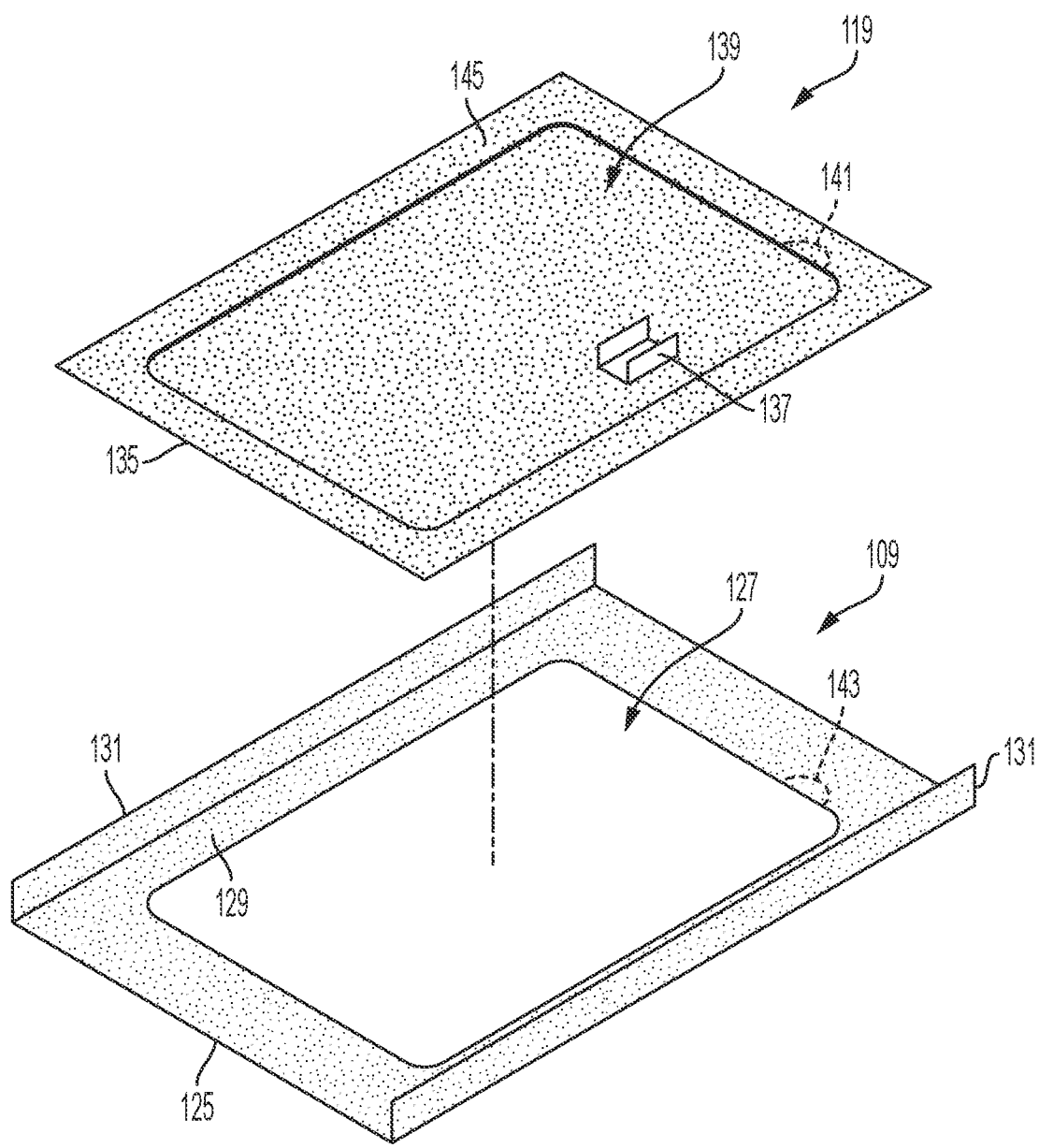
FIG. 2 illustrates an unassembled state of a tray and a chassis base that can be utilized in the system of FIG. 1 according to certain embodiments.

FIG. 2 illustrates a tray 119 and a chassis base 109 in an unassembled state. Features of the tray 119 and the chassis base 109 may be more easily viewed within FIG. 2, and thus some options of features of the tray 119 and the chassis base 109 that are shown in FIG. 2 are omitted in FIG. 1 and in some other figures for the sake of clarity.

As shown by way of example in FIG. 2, the chassis base 109 can include a bottom panel 125. The bottom panel 125 can have an opening 127 defined therethrough. For example, the opening 127 may extend vertically through the bottom panel 125. The opening can be sized to receive features of the tray 119, for example.

The bottom panel 125 may define a rim 129. For example, the rim 129 may be defined in one or more segments around or along the opening 127 in the bottom panel 125. The rim 129 may extend at least partly along a width and/or a length of the chassis base 109. In various examples, the rim 129 can be positioned at least in part between the opening 127 and sidewalls 131 of the chassis base 109. Additionally or alternatively, the rim 129 may be positioned at least in part along a portion of the opening 127 that extends toward each of the sidewalls 131. The sidewalls 131 of the chassis base 109 may engage with sidewalls 133 (FIG. 1) of the lid 111, for example.

Referring again to FIG. 2, the tray 119 can include a body 135. The body 135 may be configured for supporting the computing components 117. For example, the body 135 may be of a sufficient sizing, material, profile, and/or other features suitable for receiving and/or supporting the computing components 117. In various examples, the body 135 of the tray 119 and the bottom panel 125 of the chassis base 109 may each be formed of a same type of sheet metal. However, the tray 119 and the chassis base 109 may be formed of like or different materials relative to one another, and/or plastics or other non-metal materials may be used in addition or substitution.

In some examples, the body the 135 can include one or more mounts 137, such as brackets or other structures for engaging, supporting, or securing the computing components 117 relative to the tray 119. The body 135 may support the computing components 117 so as to be subject to a weight load from the computing components 117.

The body 135 of the tray 119 can include an embossed portion 139. For example, the embossed portion 139 may correspond to a downwardly embossed portion of the body 135. In operation, the embossed portion 139 may at least partially extend into the opening 127 of the chassis base 109. The embossed portion 139 may be embossed by an amount configured to prevent sagging of the tray 119 into the lower volume 123 under the weight load from the computing components 117. For example, the embossing of the embossed portion 139 may impart a strengthening effect (e.g., causing rigidity), which may be due to a resulting increase in the section modulus of the sheet from which the tray 119 is formed and/or in response to strain hardening that is locally introduced in the material of the sheet.

The tray 119 and/or the chassis base 109 can include features to facilitate alignment. In some examples, the features for alignment can include a matching shape of the embossed portion 139 and the opening 127. In FIG. 2, the embossed portion 139 and the opening 127 are each depicted with a rectangular profile having rounded corners, although circular, oval, triangular, square, or any other suitable shape may be utilized additionally or alternatively. In some examples, contoured portions 141 may be included in the tray 119 and match contoured portions 143 in the chassis base 109. Matching contours may facilitate indexing or may facilitate alignment in a unidirectional manner or in a way that ensures that the tray 119 is capable of aligning in a single manner with the chassis base 109. Although the contoured portions 141 and 143 are depicted as arcuate portions positioned along respective single edges of the tray 119 and chassis base 109, the contoured portions 141 and 143 may correspond to any shape at any portion of the respective parts. In addition, although the embossed portion 139 and the opening 127 are depicted in FIG. 2 as generally matching each other, in some embodiments, the embossed portion 139 and the opening 127 may differ from one another in shape, profile, contour, elevation-varying forms, and/or other features.

The tray 119 can further define a frame section 145. The frame section 145 may define a plane. The frame section 145 may extend around at least a portion of the embossed portion 139. The frame section 145 may be formed integrally with the embossed portion 139. The embossed portion 139 may extend below the plane defined by the frame section 145. The embossed portion 139 may be spaced inward from the frame section 145 (e.g., inward from a perimeter of the frame section 145). The frame section 145 of the body 135 of the tray 119 may be sized to rest atop the rim 129 of the bottom panel 125 of the chassis base 109. In FIG. 2, the frame section 145 along one of the long edges is depicted as occupying approximately 10% of an overall width of the tray 119 (e.g., which may correspond to a border of approximately 2 inches within a 19-inch server, for example). However, the frame section 135 and/or the rim 129 may be any suitable size relative to other parts, including, but not limited to, up to 50% of a relevant width, length, or other dimension of another associated part, or another ratio of sizes for facilitating engagement between the frame section 135 and/or the rim 129 and/or for facilitating other functions. An example of engagement between the frame section 135 and the rim 129 is shown in FIG. 3.

Figure 3:
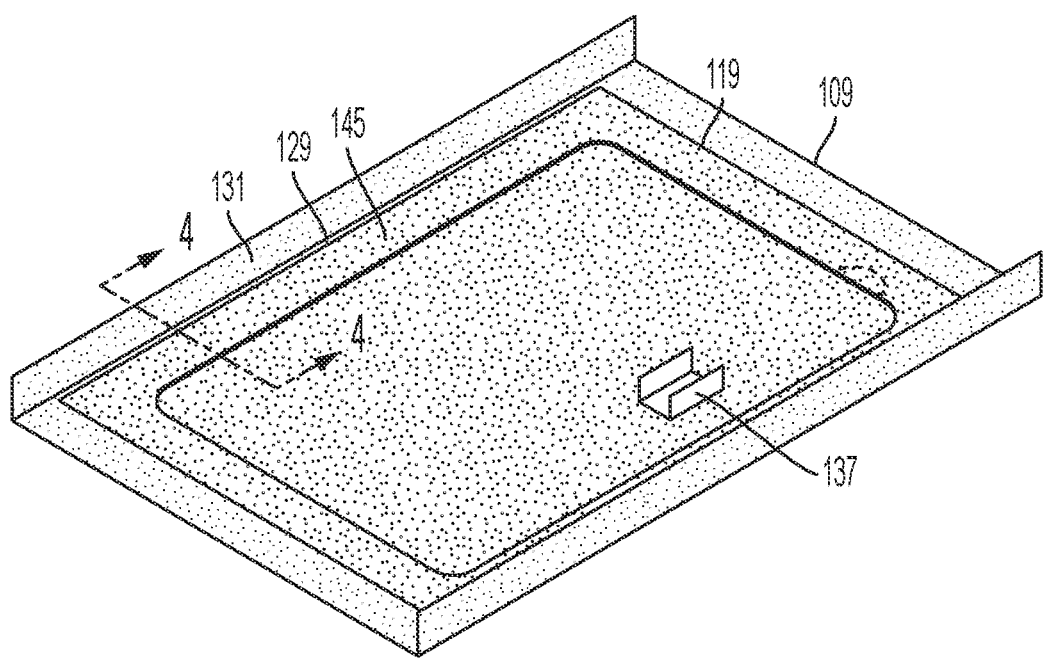
FIG. 3 illustrates an assembled state of the tray and the chassis base of FIG. 2 according to certain embodiments.

FIG. 3 illustrates the tray 119 received in the chassis base 109. In an assembled state, the frame section 145 of the tray 119 may rest atop the rim 129 of the chassis base 109. Generally, adjusting the size and/or shape of the opening 127 of the chassis base 109 and/or the embossed portion 139 of the tray 119 may allow adjustment of a loading profile of the combined assembly. In some examples, forces applied by a payload of the tray 119 (e.g., by computing components 117) may be concentrated to areas of the rim 129 of the chassis base 109 that are in contact with or otherwise engaged with the frame section 145 of the tray 119. In various aspects, the loaded areas of the rim 129 may include portions of the chassis base 109 near where the chassis base 109 has been bent to define the sidewalls 131. Such areas that have been bent to define sidewalls may be accordingly strengthened (such as by work hardening due to the bending) and thus may define suitable locations for supporting payload.

Further features may be present in the tray 119 and/or the chassis base 109. Some examples are discussed further with respect to FIG. 4.

Figure 4:
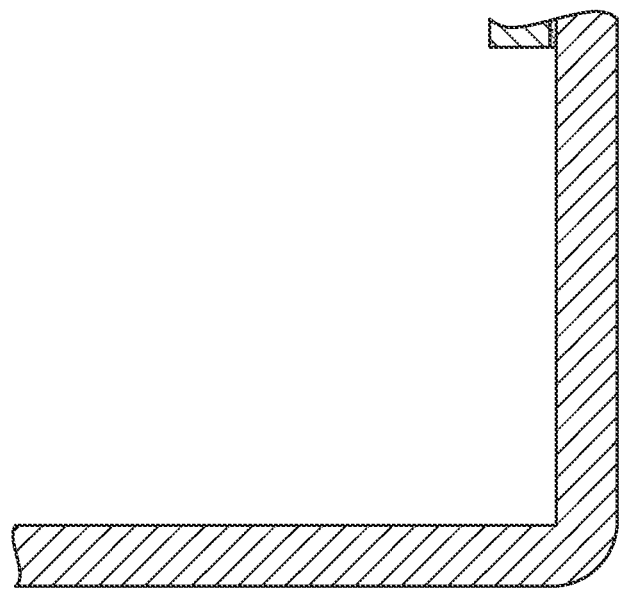
FIG. 4 is a sectional side view of a portion of the tray and the chassis base of FIG. 3 according to certain embodiments.
Figure 4:
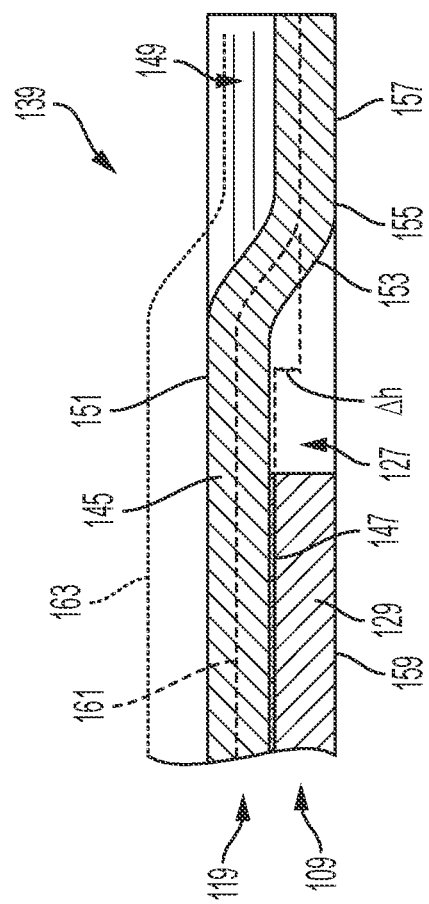

FIG. 4 is a section view taken along the section line shown in FIG. 3. In FIG. 4, the frame section 145 of the tray 119 is depicted resting atop the rim 129 of the chassis base 109. The chassis base 109 and the tray 119 can be fastened together by mechanical fasteners 147. The mechanical fasteners 147 are depicted as a layer of adhesive in FIG. 4, although the mechanical fasteners 147 additionally or alternatively may correspond to other fasteners. Other suitable examples may include rivets, screws, bolts, snap features, spot welds, or other fasteners.

Other features of the tray 119 and the chassis base 109 may be arranged relative to one another. For example, the embossed portion 139 can be positioned at least partially within the opening 127. The embossed portion 139 may define a depression 149 extending downwardly into a top side 151 of the tray 119. In various embodiments, the computing components 117 may be disposed within the depression 149 in use, although in some embodiments, the computing components 117 additionally or alternatively may be disposed on the frame section 145 and/or elsewhere on the tray 119.

The embossed portion 139 may further define a downwardly extending projection 153. The downwardly extending projection 153 may be present on a bottom side 155 of the tray 119. For example, the downwardly extending projection 153 may extend downwardly from the frame section 145.

The downwardly extending projection 153 of the tray 119 may extend into the opening 127 of the chassis base 109. The downwardly extending projection 153 can be sized to fit within the opening 127 when the frame section 145 is resting atop the rim 129. The downwardly extending projection 153 of the embossed portion 139 may be laterally sized to facilitate engagement of the tray 119 with the chassis base 109. For example, although for ease of viewing a lateral space is shown in FIG. 4 between the rim 129 and the downwardly extending projection 153, in some embodiments, the downwardly extending projection 153 may be sized to permit a press-fit or other form of engagement and/or clearance with the chassis base 109 (e.g., which may permit indexing and/or installation without a need for special tooling).

The downwardly extending projection 153 of the embossed portion 139 may be vertically sized to obtain a desired arrangement of layers in an assembly. In some examples, the downwardly extending projection 153 may be sized so that all layers of the assembly are within a particular size constraint, such as a within a volume sized to fit within a standardized height of a single rack unit (1U), within a 2U or other multiple of a 1U height, or within another predetermined height. In some examples, the downwardly extending projection 153 of the embossed portion 139 may be vertically sized so that a lowermost extremity along an underside 157 of the projection 153 is arranged flush with or above a lowermost portion of the chassis base 109 when the frame section 145 is resting atop the rim 129. For example, such arrangement may permit the tray 119 to support the computing components 117 without sagging into or extending into the lower volume 123 of an adjacent server.

In various embodiments, the amount of embossing may be selected to cause the underside 157 of the tray 119 to be arranged in a desired position when subject to the load of the computing components 117. In some embodiments the amount of emboss factors in a height added by securing via the mechanical fasteners 147.

Although FIG. 4 shows the tray 119 and the chassis base 109 as formed from sheets of substantially the same thickness, the tray 119 may be formed of a thickness that is greater than or smaller than the thickness of the chassis base 109. For example, one example of the tray 119 having a smaller thickness than the chassis base 109 is depicted by the dashed line 161 in FIG. 4. Conversely, one example of the tray 119 having a greater thickness than the chassis base 109 is depicted by the dotted line 163 in FIG. 4. With such thicknesses of the tray 119 that may vary from the thickness of the chassis base 109, the amount of the emboss of the tray 119 may be varied according to the desired location or orientation of the underside 157 of the tray 119 relative to the underside 159 or other landmark of the chassis base 109.

In some examples, use of a tray 119 that is a smaller thickness than the chassis base 109 (e.g., such as represented by way of example by the dashed line 161) can allow for recovery or addition of an amount of height Δh within the chassis 107 that would not be available if the chassis 107 were used in another configuration (e.g., without the tray 119 and opening 127). Such an additional amount of height Δh may allow for taller computing components 117 to be used, for example.

A difference in size of sheets used for the tray 119 and the chassis base 109 may be possible as an outcome of differences in materials and/or an additional strength permitted by features described herein (such as provided by the tray 119 being embossed, for example). In some embodiments, the depression 149 of the embossed portion 139 can also provide a height in which computing components can be utilized that would not be otherwise available if a flat or unembossed member were instead used for reinforcing the chassis base 109.

Other variations of the opening 127 are also possible. Some examples of such variations are described with respect to FIG. 5.

Figure 5:
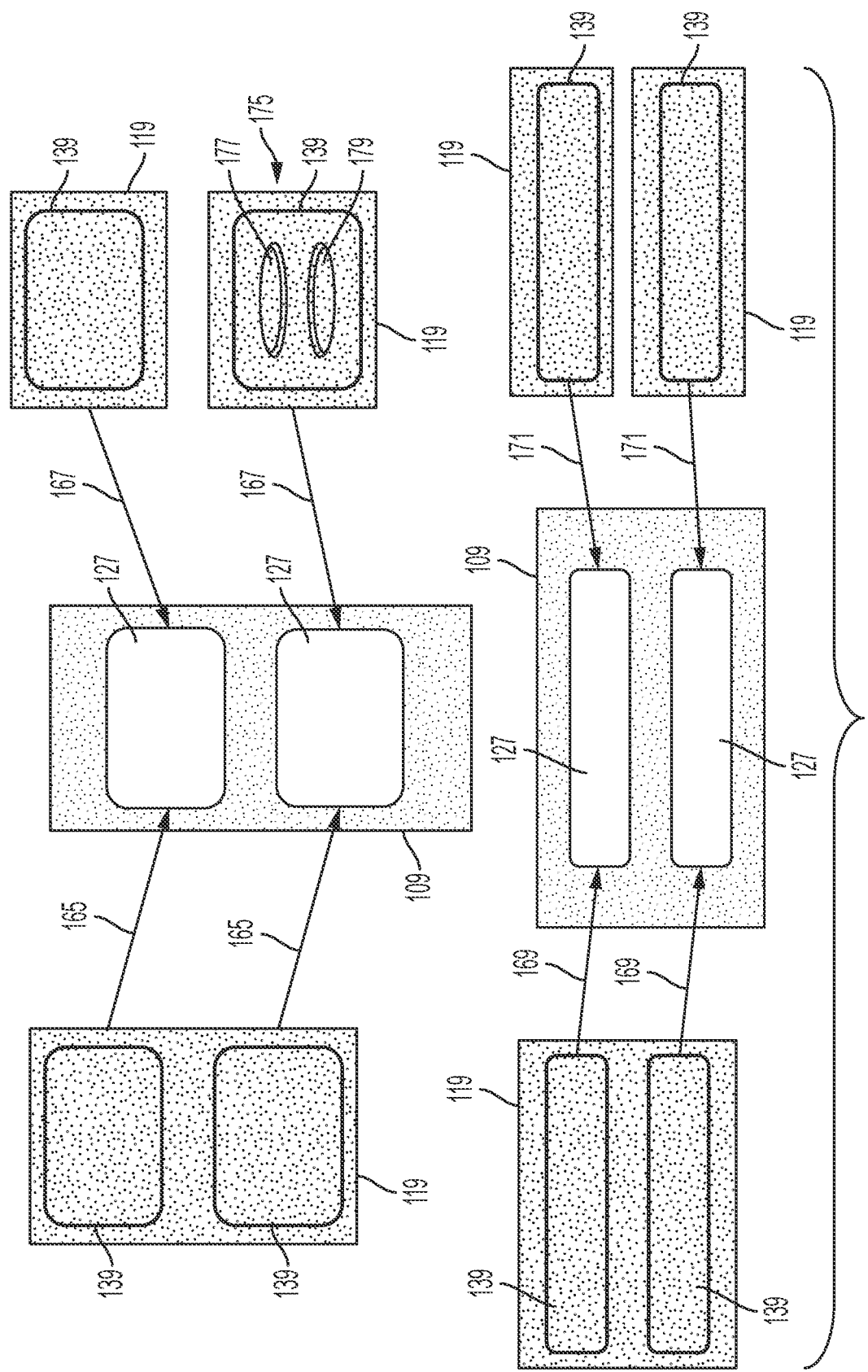
FIG. 5 illustrates examples of arrangements of multiple openings that can be utilized in trays of the system of FIG. 1 according to certain embodiments.

FIG. 5 depicts some examples of chassis bases 109 having multiple openings 127. In some examples, the multiple openings 127 may be arranged along a length of the chassis base 109 (such as depicted by the chassis base 109 in an upper portion of FIG. 5). The multiple openings 127 along the length of the chassis base 109 may be engaged by a single tray 119 having multiple embossed portions 139 (e.g., such as depicted by arrows 165) and/or by multiple trays 119 each having separate embossed portions 139 (e.g., such as illustrated by arrows 167). In some examples, the multiple openings 127 additionally or alternatively may be arranged along a width of the chassis base 109 (such as depicted by the chassis base 109 in a lower portion of FIG. 5). The multiple openings 127 along the width of the chassis base 109 may be engaged by a single tray 119 having multiple embossed portions 139 (e.g., such as depicted by arrows 169) and/or by multiple trays 119 each having separate embossed portions 139 (e.g., such as illustrated by arrows 171). FIG. 5 also illustrates some further examples of ways the embossed portion 139 may vary from the opening 127. In some embodiments, the embossed portion 139 may include one or more elevation-varying forms 175 that vary in elevation from a baseline height in the embossed portion 139. As illustrative examples, FIG. 5 depicts a ridge 177 standing proud of the embossed portion 139 and a groove 179 penetrating into the embossed portion 139, although any other combination of one or more raised and/or sunken forms may be utilized, regardless of whether mating forms are present in or adjacent the opening 127.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A server rack assembly for a datacenter, the assembly comprising:
   a server rack defining at least a lower volume and an upper volume positioned adjacent and over the lower volume;
   a lower server received in the lower volume; and
   an upper server received in the upper volume, the upper server comprising:
     a chassis base having a bottom panel through which an opening is defined, the chassis base further defining a rim around the opening;
     computing components; and
     a tray supporting the computing components so as to be subject to a weight load from the computing components, the tray having a frame section defining a plane and supported by the rim of the chassis base, the tray further having an embossed portion formed integral with the frame section and extending below the plane into the opening of the chassis base and embossed by an amount configured to prevent sagging of the tray into the lower volume under the weight load from the computing components.

2. The server rack assembly of claim 1, wherein the embossed portion defines a depression on a top side of the tray, the computing components being arranged within the depression.

3. The server rack assembly of claim 2, wherein the embossed portion defines a downwardly extending projection on a bottom side of the tray, the downwardly extending projection extending into the opening of the chassis base and having an underside arranged flush with or above a lowermost portion of the chassis base.

4. The server rack assembly of claim 3, wherein the downwardly extending projection is spaced inwardly from a perimeter of the frame section.

5. A computing equipment assembly, comprising:
   computing components;
   a tray supporting the computing components, the tray comprising:
     a frame section defining a plane; and
     an embossed portion formed integral with the frame section, the embossed portion defining a projection extending below the plane, the embossed portion further defining a depression on a top side of the tray, the frame section extending around at least a portion of the embossed portion; and
   a chassis base comprising:
     a bottom panel having an opening extending vertically therethrough and in which the embossed portion of the tray is received; and
     a rim defined around the opening in the bottom panel and supporting the frame section of the tray.

6. The computing equipment assembly of claim 5, further comprising at least one mechanical fastener coupling the frame section of the tray with the rim of the chassis base.

7. The computing equipment assembly of claim 5, wherein the chassis base further comprises sidewalls extending upwardly from the bottom panel.

8. The computing equipment assembly of claim 7, wherein the rim is positioned at least in part between the opening and the sidewalls.

9. The computing equipment assembly of claim 7, wherein the rim is positioned at least in part along a portion of the opening that extends toward each of the sidewalls.

10. The computing equipment assembly of claim 7, further comprising a lid engageable with the sidewalls to enclose the computing components within the computing equipment assembly.

11. The computing equipment assembly of claim 5, wherein the computing components comprise at least one of a printed circuit board, a fan, a solid state drive, a hard disk drive, a graphics processing unit, a heat sink, a cable, a connector, or an interface.

12. The computing equipment assembly of claim 5, further comprising:
   a rack defining at least a lower volume and an upper volume positioned adjacent and over the lower volume;
   a lower rack-mounted unit received in the lower volume; and
   an upper rack-mounted unit received in the upper volume, the upper rack-mounted unit comprising the chassis base, the computing components, and the tray, wherein the tray is embossed by an amount configured to prevent sagging of the tray into the lower volume under a weight load from the computing components.

13. A computing equipment box assembly, comprising:
a chassis base comprising:
- a bottom panel;
- an opening through the bottom panel; and
- a rim defined around the opening; and a tray comprising:
- a body configured for supporting computing components;
- a frame section of the body sized to be supported atop the rim of the chassis base; and
- a downwardly embossed portion of the body, spaced inward from the frame section and extending downwardly from the rim and sized to fit within the opening of the chassis base when the frame section is supported atop the rim of the chassis base, the downwardly embossed portion defining a depression on a top side of the tray.

14. The computing equipment box assembly of claim 13, wherein the downwardly embossed portion of the tray is sized so that an underside of the embossed portion is arranged flush with or above a lowermost portion of the chassis base when the frame section is supported atop the rim of the chassis base.

15. The computing equipment box assembly of claim 13, wherein the opening is a first opening, and wherein the chassis base further comprises a second opening.

16. The computing equipment box assembly of claim 15, wherein the embossed portion of the tray is a first embossed portion sized to fit within the first opening, and wherein the tray further comprises a second embossed portion sized to fit within the second opening.

17. The computing equipment box assembly of claim 15, wherein the tray is a first tray and the embossed portion is a first embossed portion sized to fit within the first opening, wherein the first tray is bearing the first embossed portion, and wherein the computing equipment box assembly further comprises a second tray bearing a second embossed portion sized to fit within the second opening.

18. The computing equipment box assembly of claim 13, wherein the embossed portion defines a downwardly extending projection on a bottom side of the tray, the depression sized for receiving the computing components therein, and the downwardly extending projection extending into the opening of the chassis base.

19. The computing equipment box assembly of claim 13, further comprising the computing components.

20. The computing equipment box assembly of claim 13, further comprising:
- a rack defining at least a lower volume and an upper volume positioned adjacent and over the lower volume;
- a lower rack-mounted unit received in the lower volume; and
- an upper rack-mounted unit received in the upper volume, the upper rack-mounted unit comprising the chassis base, the computing components, and the tray, wherein the tray is embossed by an amount configured to prevent sagging of the tray into the lower volume under a weight load from the computing components.

* * * * *